(12) United States Patent
Wiedenhofer

(10) Patent No.: US 10,743,422 B2
(45) Date of Patent: Aug. 11, 2020

(54) EMBEDDING A COMPONENT IN A CORE ON CONDUCTIVE FOIL

(71) Applicant: AT & S Austria Technologie & Systemtechnik Aktiengesellschaft, Leoben (AT)

(72) Inventor: Armin Wiedenhofer, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/716,788

(22) Filed: Sep. 27, 2017

(65) Prior Publication Data
US 2018/0092220 A1 Mar. 29, 2018

(30) Foreign Application Priority Data
Sep. 27, 2016 (DE) .................. 10 2016 118 278

(51) Int. Cl.
| H05K 3/30 | (2006.01) |
| H05K 1/18 | (2006.01) |
| H05K 3/46 | (2006.01) |
| H05K 1/03 | (2006.01) |
| H05K 1/09 | (2006.01) |
| H05K 3/40 | (2006.01) |
| H05K 3/00 | (2006.01) |

(52) U.S. Cl.
CPC ............ *H05K 3/30* (2013.01); *H05K 1/0306* (2013.01); *H05K 1/0353* (2013.01); *H05K 1/09* (2013.01); *H05K 1/183* (2013.01); *H05K 1/188* (2013.01); *H05K 3/4038* (2013.01); *H05K 3/4697* (2013.01); *H01L 2224/04105* (2013.01); *H01L 2224/18* (2013.01); *H01L 2224/2518* (2013.01); *H01L 2224/92144* (2013.01); *H01L 2924/1431* (2013.01); *H01L 2924/1436* (2013.01); *H01L 2924/3511* (2013.01); *H05K 3/007* (2013.01)

(58) Field of Classification Search
CPC ...... H05K 1/0306; H05K 1/0353; H05K 1/09; H05K 1/183; H05K 1/188; H05K 3/30; H05K 3/4697; H05K 3/4038; H05K 3/007; H01L 2224/18
USPC ............................... 29/832, 829, 825, 592.1
See application file for complete search history.

(56) References Cited

U.S. PATENT DOCUMENTS 7,696,005 B2   4/2010  Iihola et al.
8,705,905 B2 *  4/2014  Langer .................. G02B 6/138
                                                  385/14

(Continued)

FOREIGN PATENT DOCUMENTS

CN         1922524 A    2/2007
CN       101027948 A    8/2007

(Continued)

OTHER PUBLICATIONS

SIPO (CN); Office Action in Application 201710891542.6, dated Jul. 31, 2019, pp. 1-13, Beijing, China.

(Continued)

*Primary Examiner* — Peter Dungba Vo
*Assistant Examiner* — Azm A Parvez
(74) *Attorney, Agent, or Firm* — Robert A. Blaha; Smith Tempel Blaha LLC

(57) ABSTRACT

A method of embedding a component in a component carrier, wherein the method comprises providing a cured core with a recess on an electrically conductive foil, and mounting the component in the recess on the foil.

13 Claims, 5 Drawing Sheets

(56) References Cited

U.S. PATENT DOCUMENTS

| | | | | |
|---|---|---|---|---|
| 8,745,860 | B2* | 6/2014 | Inui | H05K 1/186 |
| | | | | 29/830 |
| 9,113,575 | B2 | 8/2015 | Shimizu | |
| 2008/0094805 | A1 | 4/2008 | Tuominen et al. | |
| 2010/0170703 | A1 | 7/2010 | Iihola et al. | |
| 2011/0291293 | A1* | 12/2011 | Tuominen | H05K 1/0271 |
| | | | | 257/774 |
| 2014/0085854 | A1* | 3/2014 | Tsuyutani | H05K 1/03 |
| | | | | 361/783 |
| 2015/0189763 | A1* | 7/2015 | Schrittwieser | H05K 1/188 |
| | | | | 361/761 |

FOREIGN PATENT DOCUMENTS

| | | |
|---|---|---|
| CN | 104054402 A | 9/2014 |
| CN | 104322157 A | 1/2015 |
| CN | 104509222 A | 4/2015 |
| EP | 1 137 066 A2 | 9/2001 |
| EP | 2 854 168 A2 | 4/2015 |
| FI | 20031341 A | 3/2005 |
| JP | 2001291800 A | 10/2001 |
| TW | 201134338 A | 10/2011 |
| WO | WO 2014005167 A1 | 1/2014 |

OTHER PUBLICATIONS

English translation of Office Action in Application 201710891542.6, dated Jul. 31, 2019, pp. 1-3.

Fengjuan, Zhu; Office Action in Application 201710891542.6, dated Mar. 16, 2020, pp. 1-8, CNIPA, Beijing, China.

English translation of Office Action in Application 201710891542.6, dated Mar. 16, 2020, pp. 1-8.

* cited by examiner

EMBEDDING A COMPONENT IN A CORE ON CONDUCTIVE FOIL

CROSS-REFERENCE TO RELATED APPLICATIONS

This application claims the benefit of the filling date of German Patent Application No. DE 10 2016 118 278.8 filed Sep. 27, 2016, the disclosure of which is hereby incorporated herein by reference in its entirety.

TECHNICAL FIELD

The invention relates to a method of embedding a component in a component carrier, a component carrier and an auxiliary structure.

TECHNOLOGICAL BACKGROUND

Conventionally, naked dies and other components are packaged in mold compounds made of plastic or resin. However, embedding components is also possible in a laminate such as a printed circuit board (PCB). Currently, embedding is carried out by mounting a component in a through hole of a core closed by a sticky tape, followed by the formation of a build-up.

Hence, it is known to embed components in printed circuit boards. However, a corresponding manufacture may be challenging.

SUMMARY

There may be a need to enable embedding of a component into a component carrier with a simple manufacturing method.

According to exemplary embodiments, a method of embedding a component in a component carrier, a component carrier and an auxiliary structure according to the independent claims are provided.

According to an exemplary embodiment of the invention, a method of embedding a component in a component carrier is provided, wherein the method comprises providing a cured core with a recess on an electrically conductive foil, and (in particular subsequently) mounting the component in the recess on the foil.

According to another exemplary embodiment of the invention, a component carrier is provided which comprises a cured core with a recess on an electrically conductive foil, and a component mounted in the recess on the foil.

According to still another exemplary embodiment of the invention, an auxiliary structure for manufacturing a component carrier with embedded component is provided, wherein the auxiliary structure comprises or consists of an electrically conductive foil, and a core arranged on the foil and comprising at least one recess configured for accommodating a component.

OVERVIEW

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "core" may particularly denote already cured electrically insulating material providing a stable base for embedding one or more components. A core may be made of cured resin (such as epoxy resin) with fibers (such as glass fibers) embedded therein, for example FR4. In particular, such a core may be made of a thickness being higher than that of a single layer (such as a prepreg layer) as used in PCB technology.

In the context of the present application, the term "fully cured" may particularly denote a material property according to which the corresponding material (such as resin) is not capable any more of being remelted to become flowable and of being subsequently re-solidified for interconnecting various elements of the manufactured component carrier. In particular, resin material of the fully cured core may be already cross-linked. Thus, the fully cured core material may be C-stage material rather than A-stage or B-stage material.

In the context of the present application, the term "component" may particularly denote any bulky rather than layer-type active (such as a semiconductor chip) or passive (for instance a copper block) component embedded within an interior of the component carrier.

According to an exemplary embodiment of the invention, a component is embedded in a component carrier by mounting the component on a surface of an electrically conductive foil (for instance by an adhesive) arranged beneath a recessed and fully cured dielectric core. This allows also embedding of components (such as thin semiconductor chips) with various geometric and electronic functions, wherein at least part of the foil can be simultaneously used as a permanent part of the readily manufactured component carrier (for instance may form at least part of a wiring structure for electrically connecting various portions of the component carrier under manufacture). Moreover, such a manufacturing procedure allows the entire thickness of the component carrier to be very thin. Thus, a high degree of compactness may be obtained. Furthermore, the entire manufacturing procedure is simple, since handling of a sticky tape as an auxiliary structure for manufacturing a component carrier can be dispensable according to an exemplary embodiment. Advantageously, the component is mounted on the foil in the core which is already fully cured. By forming the core from a fully cured material, no re-melting of resin (or the like) of the core takes place upon laminating the core with a component within a plurality of layer structures. Thus, the core remains a stable and spatially well-defined accommodations base for the component even during the lamination. The fact that one or more holes (such as through holes or blind holes) of the electrically conductive foil may be used as alignment markers during manufacture of the component may ensure a highly accurate registration.

Advantageously, it is possible to use a recess in a core as a starting point for an embedding procedure, thereby obtaining high stability combined with a strong suppression of warpage. Simultaneously, it is possible to get rid of temperature limitations which are conventionally involved by a sticky tape as temporary carrier. Omitting such a sticky tape as temporary carrier and substituting it by a metallic foil as permanent carrier is also a resource saving and environmental friendly solution. A precise alignment with regard to the components using pre-formed alignment markers on the foil is additionally advantageous. Both on the front side as well as on the back side, a full area may be used for a wiring structure for electrically contacting an embedded component of freely selectable size.

According to yet another embodiment, a patterned foil with a recessed core thereon may serve as an easily manufacturable and highly useful auxiliary structure which can be used as a starting point for manufacture of a component carrier, in particular for manufacturing a component carrier with embedded component.

In the following, further exemplary embodiments of the method, the component carrier, and the auxiliary structure will be explained.

In an embodiment, an upper exposed surface of the (preferably dielectric) core is free of electrically conductive material at the beginning of the manufacturing procedure. The formation of wiring patterns on one or both opposing main surfaces of the core may be carried out later on the basis of the electrically conductive foil and/or a further metallic foil with which may be laminated on the upper exposed surface of the core.

In an embodiment, the electrically conductive foil is integrally connected with a carrier structure with a release layer in between. In such a configuration, the electrically conductive foil (or at least part thereof) may form part of the readily manufactured component carrier so that the latter can be manufactured in a resource saving manner. However, to use such a foil in a readily manufactured component carrier, it is preferred that this foil is quite thin (for instance having a thickness in the range between 1 µm and 10 µm, more particularly in the range between 2 µm and 5 µm). However, such a small thickness may be insufficient to provide sufficient stability during the embedding process. For that reason, it is possible that an electrically conductive carrier is temporarily attached to the foil and is provided with a sufficiently large thickness (for instance in a range between 20 µm and 100 µm, more particularly in a range between 35 µm and 70 µm) so that it can provide mechanical support during the embedding procedure. This improves the handling. After the embedding, the carrier structure may be removed (and can be optionally used again) so that it does not form part of the readily manufactured component carrier. This removal may be carried out by an intentional delamination between foil and carrier structure at the release layer. The latter may be specifically configured for promoting such a delamination (for instance may be made of a waxy component). A corresponding layer sequence may be used also on a top side of the component carrier under manufacture (compare for example FIG. 9) so as to promote a symmetric geometry in a vertical stacking direction. A symmetric configuration keeps mechanical tension small and thereby suppresses warpage. Hence, the method may further comprise interconnecting a further electrically conductive foil above the core and the component, wherein the further electrically conductive foil is integrally connected with a further carrier structure with a yet another release layer in between.

In an embodiment, the carrier structure is removed from the electrically conductive foil at the release layer after mounting the component. This results in a compact configuration of the readily manufactured component carrier.

In an embodiment, the method further comprises forming at least one hole in the electrically conductive foil (in particular simultaneously in both the electrically conductive foil and the carrier structure). This can be carried out by laser drilling, or mechanical drilling. The formed holes may be used for various purposes:

For instance, at least one of the at least one hole is used as an alignment marker. Thereby, the registration accuracy may be rendered high.

It is also possible that at least one of the at least one hole is used for electrically contacting the component. Thus, it is also possible, additionally or alternatively, that at least one of the at least one hole is used as an access hole for forming an exterior contact to the one or more embedded components. For that purpose, the respective hole may be filled with electrically conductive material such as copper. Hence, at least a part of the at least one hole may be filled with electrically conductive material (such as copper) so as to contact the component. Such a filling procedure may be accomplished by plating. More generally, the hole(s) may be used as a volume to be filled with electrically and/or thermally conductive material for electrically and/or thermally coupling the component with an exterior of the component carrier. Hence, the component may also impact the electric performance of the component carrier by promoting the removal of heat from an interior of the component carrier.

In an embodiment, the hole has the shape of a truncated cone tapering from the electrically conductive foil towards the carrier structure. Correspondingly, the component carrier may have one or more holes having the shape of a truncated cone tapering in a direction away from the component. This shape may be the consequence of a laser drilling process for forming the hole(s).

In an embodiment, the recess in the core is formed by forming a patterned further release layer on the electrically conductive foil, applying electrically insulating material on the patterned further release layer and the electrically conductive foil, and removing electrically insulating material on top of the patterned further release layer. Material also of this release layer may have the property that it may have poor adhesion with regard to adjacent material. This property may be advantageously used for cavity formation. For that purpose, electrically insulating material may be placed above the further release layer. By annularly cutting through the electrically insulating material above the release layer, a ring plate may be separated from the rest of the electrically insulating material and may be removed to thereby form the recess or cavity. The remaining portion of the electrically insulating material may constitute to the core in such an embodiment.

It is however alternatively also possible to connect a precut core with an electrically conductive foil (which may be, in turn, separated from an electrically conductive carrier structure via a release layer) by a pressing force and/or adhesive material.

In an embodiment, the method further comprises applying an adhesive (such as a liquid adhesive), in particular by one of dispensing and printing, in the recess on the foil and prior to mounting the component on the foil. By taking this measure, it can be ensured that the component is glued in place on a precisely definable position.

In an embodiment, the method further comprises filling a gap between the core and the component with a filler material. This laterally immobilizes the embedded component and thereby contributes to a high positional accuracy and reliability. The filler material may be for example adhesive or resin re-melted during a lamination procedure.

In an embodiment, the method further comprises interconnecting at least one electrically conductive layer structure and/or at least one electrically insulating layer structure with the filler material and the core. In the context of the present application, the term "layer structure" may particularly denote a full or continuous layer, a patterned layer, or a plurality of islands-type separate elements formed together within a plane.

In an embodiment, the method further comprises filling a gap between the core and the component and covering the core and the component by laminating at least one electrically insulating layer structure on the core and the component. In particular, the application of pressure and/or heat may render the material of the at least one electrically insulating layer structure flowable so that such material may flow into the gap and may permanently remain within the gap after re-solidification or curing. Thus, filling the gap and covering the component and the core from above may be carried out in a single common simultaneous procedure. For this purpose, it may be advantageous that the electrically insulating layer structure is at least partially formed of an at least partially uncured material. The interconnecting may hence be accomplished by curing at least partially uncured material of the at least one electrically insulating layer structure. In the context of the present application, the term "interconnecting by curing" particularly denotes that the connection of the elements of the component carrier is accomplished by a pressure-induced and/or temperature-induced temporary melting and subsequent permanently solidifying of the at least partially uncured material, which is thereby fully cured. The melted material thereby intermingles with juxtaposed or adjacent material and, after hardening by release of the elevated pressure and/or elevated temperature, ensures an integral connection of the previously separated elements, now forming an integral component carrier.

In an embodiment, the further carrier structure is removed from the further electrically conductive foil at the other release layer after the interconnecting. Before and during the interconnecting, the further carrier structure may provide additional support and mechanical stability. After the interconnecting, the further carrier structure may be removed so as to render the manufactured component carrier compact.

In an embodiment, an adhesive, in particular, an electrically insulating adhesive is arranged at least partially between the component and the foil. This ensures that the component remains at a fixed position during and after the embedding and that nevertheless the use of a sticky tape is dispensable.

In an embodiment, a through hole extending through the foil, in particular a hole extending through the foil and the adhesive, is filled with electrically conductive material for contacting the component. More specifically, the (part of the) hole extending through the foil may be a through hole. This renders it possible that the through hole extending through the foil may be later filled with electrically conductive material for establishing an electric connection from an exterior of the component carrier to the component within an interior thereof. Furthermore, it is sufficient that the part of the hole extending through the carrier structure is a blind hole which keeps mechanical integrity and removability of the carrier structure high and keeps the manufacturing effort for the formation of the part of the hole extending through the carrier structure small.

In an embodiment, the electrically conductive foil and the carrier structure are metal foils, in particular copper foils. By manufacturing foil and carrier structure from the same material, thermal mismatch and other sources for mechanical tension may be kept small.

In an embodiment, the auxiliary structure comprises a primer (in particular a primer layer on the foil) of adhesion promoting material between the core and the foil. This improves mechanical integrity of the auxiliary structure and prevents delamination.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as an electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
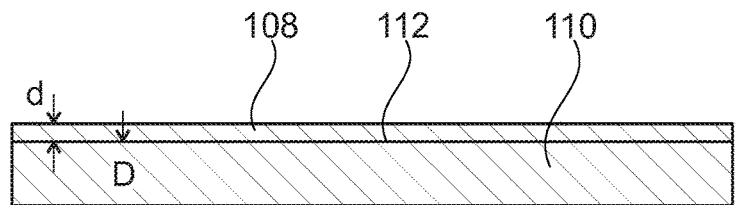
FIG. 1, FIG. 2, FIG. 3, FIG. 4, FIG. 5, FIG. 6, FIG. 7, FIG. 8, FIG. 9, FIG. 10 and FIG. 11 collectively illustrate different cross-sectional views of structures obtained during an execution of a method of manufacturing a component carrier according to an exemplary embodiment of the invention.

The illustrations in the drawings are presented schematically. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, highly accurate registration embedding is made possible. In particular, an embodiment provides an embedding architecture with a highly precise concept for registration for the manufacture of multiple layer (for instance two layer) component carriers with the opportunity of embedding very small, but also extraordinarily large components.

The mentioned high registration accuracy upon forming contacts for electrically contacting components can be achieved by an alignment on the basis of markers which may for instance be formed as through holes in a foil in a UV (ultraviolet) laser procedure. More particularly, such an improved registration accuracy is particularly advantageous in the scenario of a double-sided contacting of passive or active components using one or more registration marks which may be formed by laser processing for front and/or back contacting. Contrary to conventional center core concepts, exemplary embodiments of the invention provide the opportunity to place a full surface design on both sides of a multilayer module. By embedding components in a preformed core, the component carrier may also be improved or even optimized in terms of warp and twist properties. Exemplary embodiments provide a large flexibility what concerns dimensions of components to be embedded in a component carrier, and in particular to allow the embedding of very large and very small components. Conventional limitations resulting from the implementation of a sticky tape as temporary carrier do not occur in the framework of exemplary embodiments of the invention. In particular, an exemplary embodiment of the invention provides a high flexibility in terms of the selection of plugin pastes, so that there is no or at least no significant thermal mismatch between paste and base material. Furthermore, no issues occur which are related to bond film (no registration issues in a pick and place process, no residues after removal of the tape, etc.). Furthermore, there are no issues related to the temporal synchronization of manufacturing procedures. It is also possible to reduce a thickness of a dielectric material between the layers of contacting and the contacting pads of the components. It is also possible to realize large differences in terms of component thickness within one component carrier.

In particular, exemplary embodiments of the invention differ from conventional center core technologies by the capability of providing an improved registration accuracy upon forming contacts of the components to be embedded. Moreover, the manufacturing architecture according to exemplary embodiments of the invention include no limitations in terms of size of the component to be embedded and is therefore highly flexible.

Exemplary embodiments of the invention provide an improved technology to realize an accurate double-sided component interconnection with a high variation regarding component height difference within a single card.

According to an exemplary embodiment of the invention, a separate lamination procedure after cavity filling may be dispensable so that the dielectric thickness between contacting layer and components may be reduced. As a result, it is possible to select a small laser diameter and to obtain consequently smaller rest rings. Furthermore, registration accuracy for a double-sided component connection may be improved, since an alignment procedure may make use of registration marks formed in a laser process.

FIG. 1 to FIG. 11 illustrate different cross-sectional views of structures obtained during a performance of a method of manufacturing a component carrier 102 according to an exemplary embodiment of the invention. During this manufacturing process, a component 100 is embedded in the component carrier 102 under manufacture.

Referring to FIG. 1, an electrically conductive foil 108 (such as a copper foil) of a first thickness d (for instance in a range between 1 μm and 10 μm, in particular in a range between 2 μm and 5 μm) is shown which is integrally connected with a carrier structure 110 (such as a further copper foil) of a second thickness D which may be larger than the first thickness (for instance in a range between 20 μm and 100 μm, in particular in a range between 35 μm and 70 μm). The foil 108 and the carrier structure 110 are connected to one another and separated from one another by a release layer 112 in between. The release layer 112 may for instance be made of a waxy material and may have the property of showing a poor adhesion to both the foil 108 and the carrier structure 110. Consequently, it is later possible to easily remove the carrier structure 110 from the foil 108 by simply peeling it off. Until such a removal is initiated, the carrier structure 110 provides mechanical stability and therefore serves as a metallic temporary carrier 110. In contrast to this, material of the foil 108 forms part of the readily manufactured component carrier 102 (compare FIG. 11). Optionally, a primer (for instance a thin layer, not shown in FIG. 1) may be applied on an exterior surface of the foil 108 for promoting adhesion of a core 104 (compare FIG. 6) on the foil 108.

Figure 2:
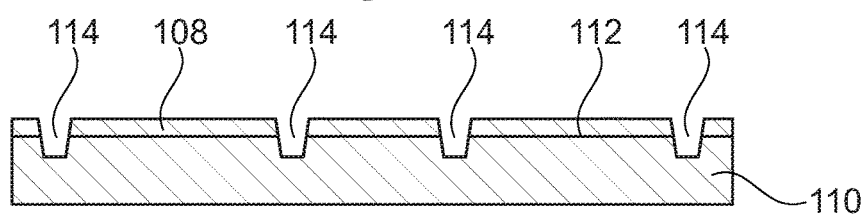

Referring to FIG. 2, holes 114 are formed in both the electrically conductive foil 108 and the carrier structure 110. This can be accomplished by laser drilling (for instance implementing a UV laser process, overlay and copper open). Consequently, the holes 114 have the shape of a truncated cone tapering in a direction away from the electrically conductive foil 108 and towards the carrier structure 110. Alternatively, a mechanical drilling procedure or an etching procedure may be carried out. In the shown embodiment, the holes 114 are composed of a through hole portion extending through the entire thickness d of the foil 108 and a blind hole portion extending only into an upper portion of the temporary carrier 110. Advantageously, part of the holes 114 may be used as an alignment marker for improving registration accuracy, and part of the holes 114 may be later filled with electrically conductive material for contacting a component 100 to be embedded (compare transition from FIG. 10 to FIG. 11).

Figure 3:
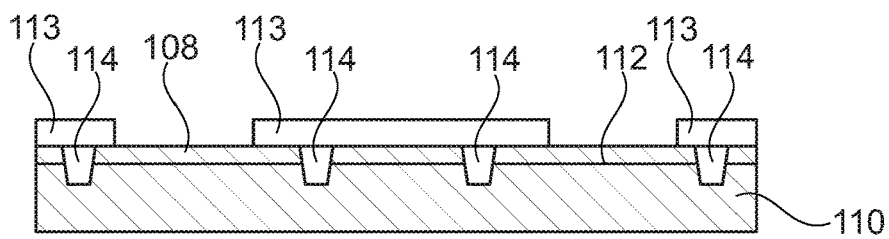

Referring to FIG. 3, a recess 106 (compare FIG. 6) to be formed subsequently in the core 104 is defined by forming a patterned further release layer 113 only on part of the surface of the electrically conductive foil 108. The formation of the further release layer 113 may be accomplished by printing or alternatively by a deposition, lithography and etching procedure.

Figure 4:
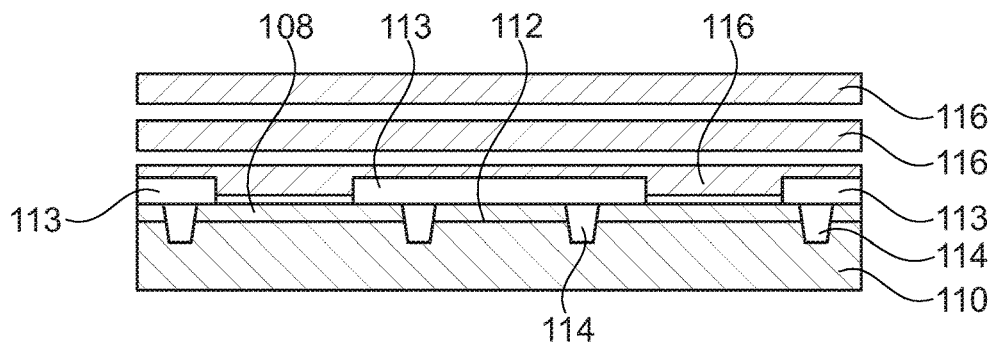

Referring to FIG. 4, still in the framework of defining the recess 106 in the core 104, electrically insulating material 116 is arranged on the patterned further release layer 113 and the electrically conductive foil 108. More specifically, the electrically insulating material 116 is composed of multiple electrically insulating layers made of at least partly uncured material, for instance made of prepreg (i.e. a matrix of resin, such as epoxy resin, with reinforcing fibers therein, in particular glass fibers). The procedure according to FIG. 4 may be denoted as a lay-up/relamination process.

Figure 5:
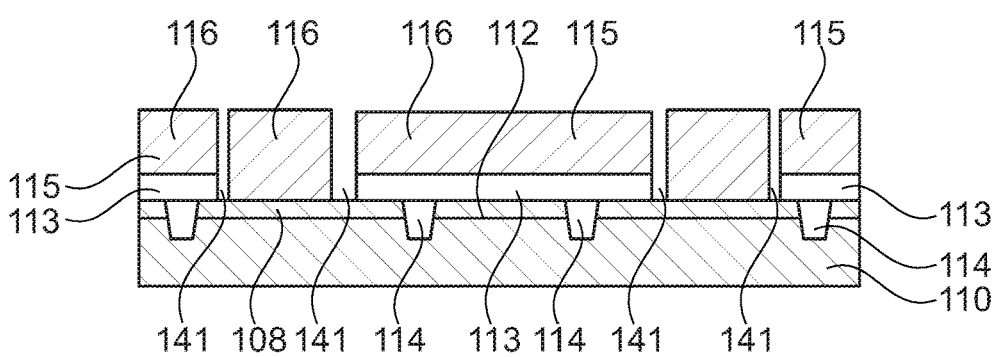

Referring to FIG. 5, the elements of the structure shown in FIG. 4 are interconnected by lamination, i.e. by applying mechanical pressure, if desired in combination with heat. During the lamination, the previously at least partly uncured material of the electrically insulating material 116 is cured, for instance by cross-linking.

Subsequently, a laser cutting procedure (alternatively a mechanical cutting procedure or an etching procedure) is carried out for forming annular through holes 141 through the electrically insulating material 116. The through hole formation may be controlled so that sections about the further release layer 113 are separated from the rest of the electrically insulating material 116. Thereby, removable caps 115 are formed on top of the further release layer 113.

Figure 6:
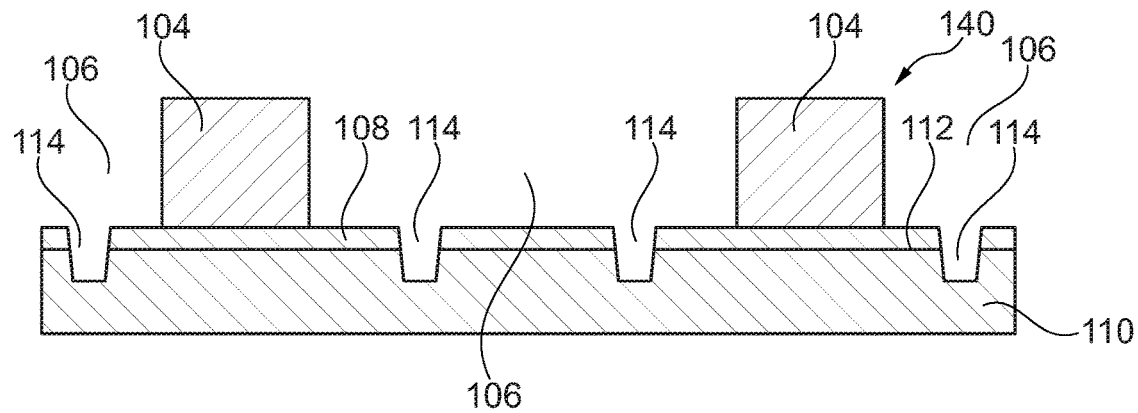

Referring to FIG. 6, the caps 115 may be removed and the further release layer 113 may be stripped. Thereby, formation of the recesses 106 in the core 104 is completed by removing sections of electrically insulating material 116 on the patterned further release layer 113, and by removing the further release layer 113 itself. As a result, an auxiliary structure 140 composed of cured core 104 with recesses 106 on the integrally connected electrically conductive foil 108 with layers 112, 110 beneath is obtained.

This auxiliary structure 140 may be advantageously used for manufacturing component carriers 102, in particular for embedding components 100 in such component carriers 102. The auxiliary structure 140 according to the exemplary embodiment shown in FIG. 6 consists of the electrically conductive foil 108, the carrier structure 110, the release layer 112 in between, the holes 114 extending fully through the foil 108 and here partly through the carrier structure 110 and the recessed core 104 on the foil 108. In the shown embodiment, an upper exposed surface of the here fully dielectric core 104 is free of electrically conductive material.

Figure 17:
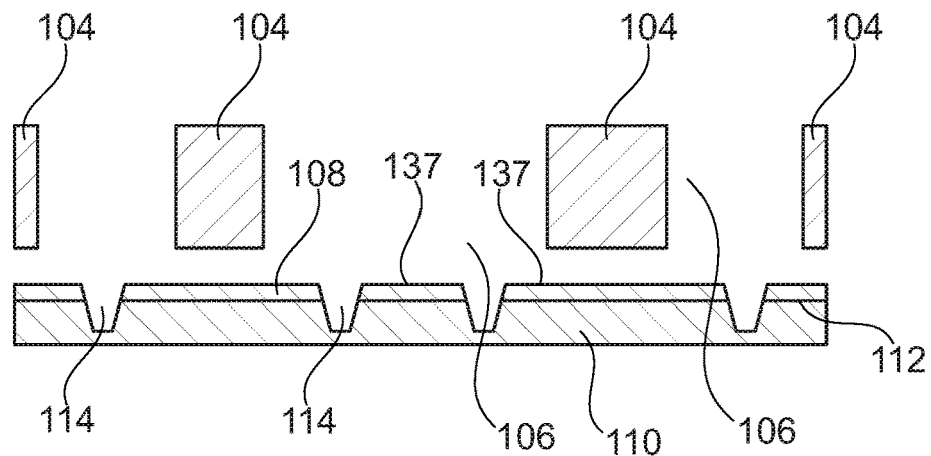
FIG. 17, FIG. 18 and FIG. 19 collectively illustrate different cross-sectional views of structures obtained while carrying out alternative methods according to other exemplary embodiments of the invention.

It should be mentioned that, as an alternative to the manufacturing procedure described referring to FIG. 3 to FIG. 5, an auxiliary structure 140 similar to that shown in FIG. 6 may also be manufactured by replacing a portion of the foil 108 with and adhesive layer 137 as shown in FIG. 17.

It should be further mentioned that, as another alternative to the procedure described in referenced to FIG. 3, FIG. 4 and FIG. 5 to manufacture an auxiliary structure 140, as shown in FIG. 6, may also be obtained by bonding a pre-cut core 104 on the foil 108, which is in turn arranged on the carrier structure 110 with the release layer 112 in between (see also FIG. 17).

Figure 7:
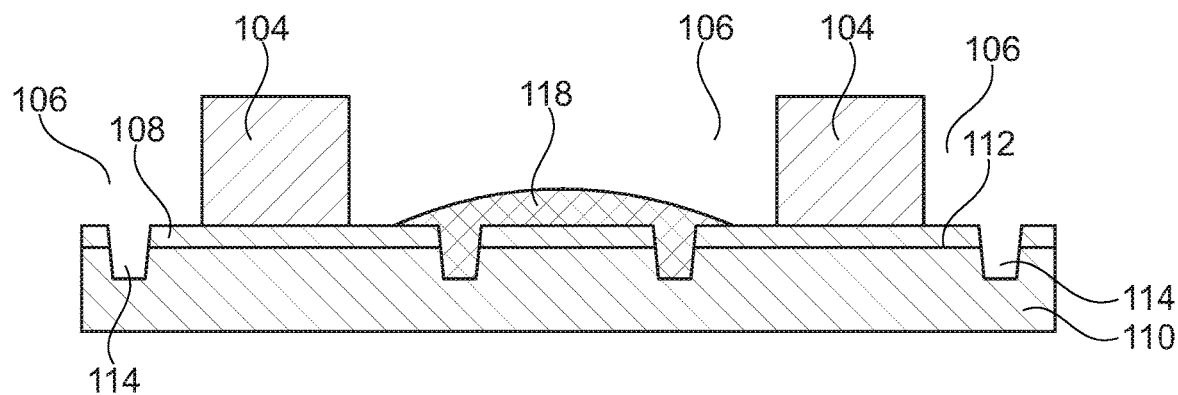

Referring to FIG. 7, a liquid adhesive 118, which may for instance be embodied as epoxy based adhesive, may be applied to the recess 106 and on the foil 108 for example by dispensing or printing. This procedure may be carried out still prior to and in preparation of a subsequent mounting of the component 100 on the foil 108. Optionally a vacuum treatment may be carried out for removing bubbles from the adhesive 118.

Figure 8:
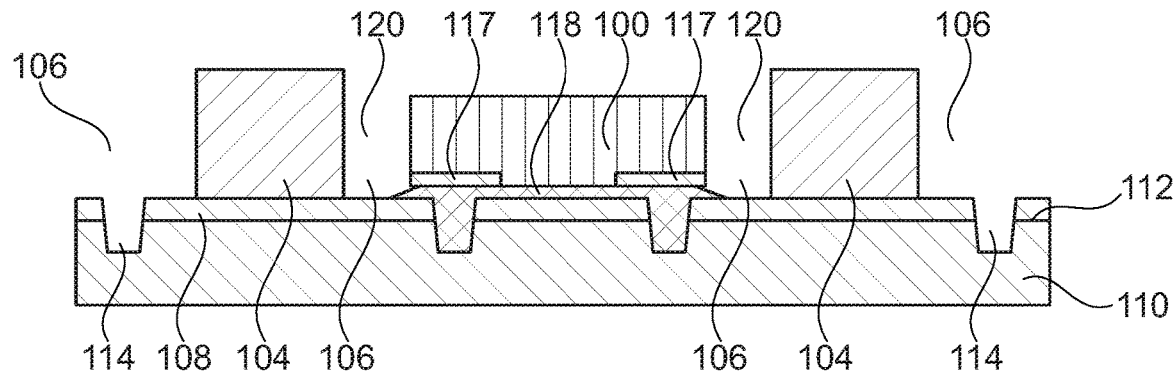

Referring to FIG. 8, the component 100 is mounted in the recess 106 on the foil 108 with the adhesive 118 in between. As can be taken from FIG. 8, the holes 114 have the shape of a truncated cone tapering in a direction away from the component 100. FIG. 8 shows that the component 100 is mounted face down, i.e. with its active surface and pads 117 facing the foil 108. However, alternatively, it is also possible that the component 100 is mounted face up, i.e. with its active surface and pads 117 opposing the foil 108. Also a component 100 having pads 117 on both opposing main surfaces thereof may be embodied in a component carrier 102 according to another exemplary embodiment of the invention.

During the described assembly process, the laser drilled fiducials or holes 114 may be used for alignment to obtain a high registration accuracy. After alignment of the component 100 in the recess 106, the adhesive 118 may be cured. As a consequence of the described manufacturing architecture, a circuit designer is free in the selection of size and thickness of one or more components 100 to be embedded in a component carrier 102 under manufacture. Mounting the component 100 in the recess 106 after formation of the cured core 104 results in low warpage. As can be taken from FIG. 9, the type and/or amount of adhesive 118 may be selected so that the adhesive 118 covers the entire lower surface of the component 100 and also extends laterally beyond the lateral borders of the component 100. However, alternatively it is also possible that the type and/or amount of adhesive 118 is selected so that the adhesive 118 does not extend laterally beyond the lateral borders of the component 100.

Figure 9:
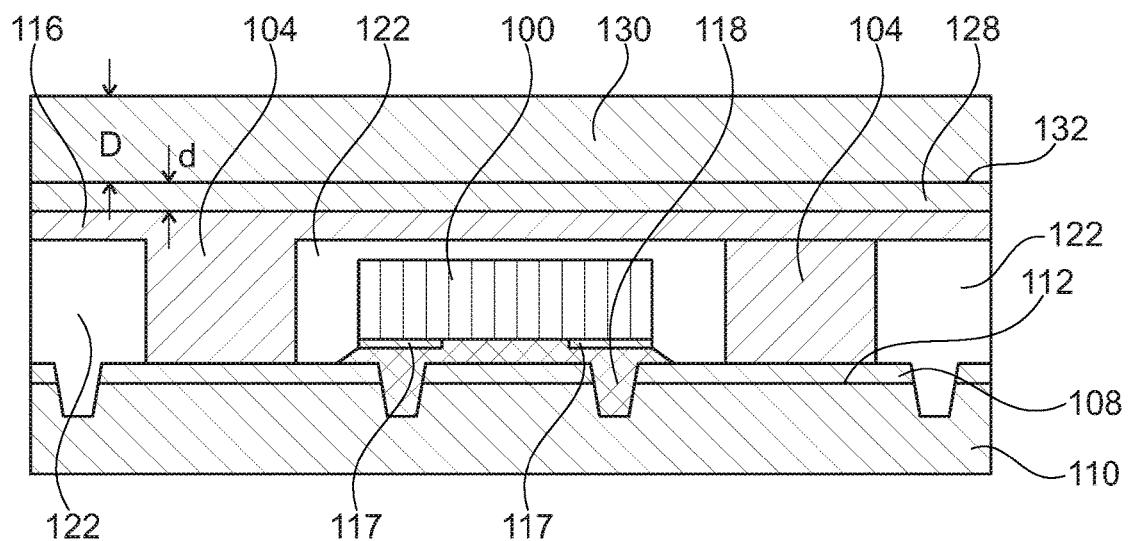

Referring to FIG. 9, a lateral gap between the core 104 and the component 100 may be filled with a filler material 122 (such as an adhesive, resin, or prepreg). An electrically insulating layer structure 116 (such as one or more prepreg layers or one or more other layer structures of at least partly uncured material) may be laminated on the core 104 and the component 100.

As an alternative to the described procedure of FIG. 9, the method may comprise a procedure of filling a gap between the core 104 and the component 100 and covering the core 104 and the component 100 only by lamination of at least one electrically insulating layer structure 116 (such as one or more prepreg layers or one or more other layer structures of at least partly uncured material) on the core 104 and the component 100. In such an embodiment, the provision of separate filler material 122 is dispensable, because curable material of the at least one electrically insulating layer structure 116 may also flow into the gap during laminating.

The manufacturing method may further comprise a procedure of interconnecting a further electrically conductive foil 128 above the core 104 and the component 100. In a corresponding manner as described referring to FIG. 1, the further electrically conductive foil 128 may be integrally connected with a further carrier structure 130 with yet another release layer 132 in between. Thus, the structure shown in FIG. 9 may be manufactured by carrying out a plug-in, curing and relamination process.

Figure 10:
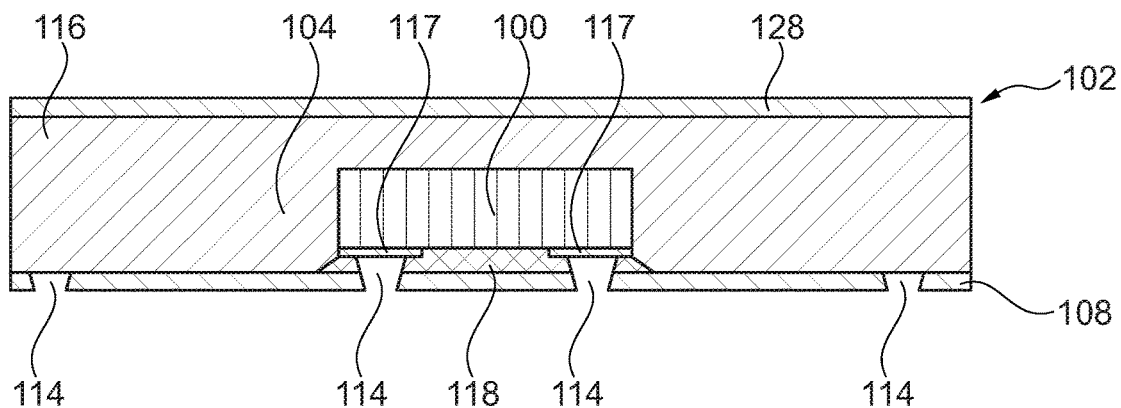

Referring to FIG. 10, the further carrier structure 130 (see FIG. 9) is removed from the further electrically conductive foil 128 by peeling it off at the other release layer 132 after the interconnecting by lamination. Furthermore, the carrier structure 110 is removed from the electrically conductive foil 108 by peeling it off at the release layer 112 after laminating. Subsequently, adhesive 118 within the holes 114 may be removed. For example, this may be accomplished by a laser desmear process. For instance, a cleaning procedure using a (for example $CO_2$) laser may be carried out which etches away exposed resin/adhesive under the component 100. As a result of this removal procedure, the pads 117 are exposed.

Figure 11:
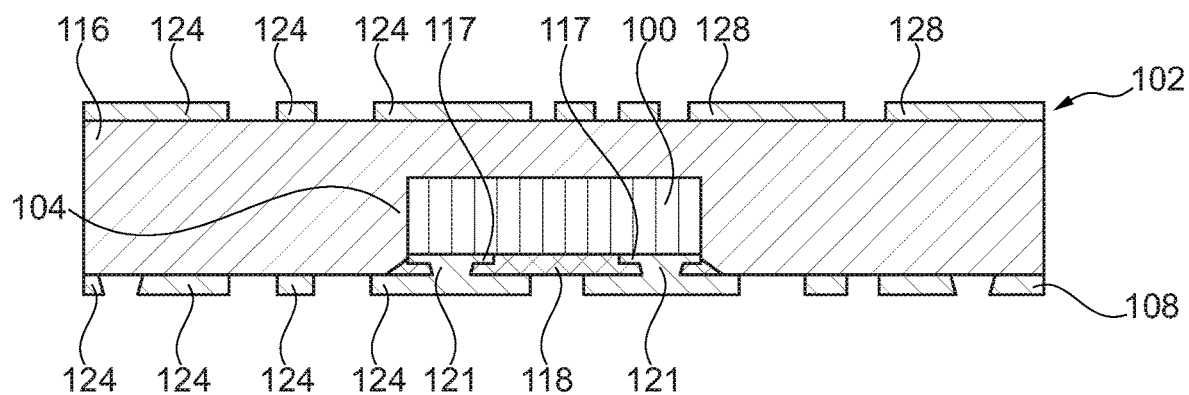

Referring to FIG. 11, the holes 114 which have previously been emptied by the above described removal procedure, are filled with electrically conductive material (such as copper) to thereby form vertical through connections 121 (such as vias) as external electric contacts of the component 100. This can be carried out by a copper plating process.

Thereafter, the foil 108 as well as the further foil 128 on the opposed main surfaces of the structure of FIG. 10 may be patterned by a lithography and etching procedure to thereby form electrically conductive layer structures 124 of the obtained component carrier 102.

The electrically conductive layer structures 124 and electrically insulating layer structures 116 are interconnected with the filler material 122 and the core 104 to form, inter alia, a central integral dielectric structure surrounding the embedded component 100 along a significant portion of its circumference.

As a result of the described manufacturing procedure, component carrier 102 shown in FIG. 11 is obtained. The component carrier 102 comprises the cured core 104 absent recess 106 (no longer visible in FIG. 11). The component 100, which is here embodied as a semiconductor chip, is mounted in the volume vacated by the recess 106 of the core 104 and on the patterned foil 108. Only the electrically insulating adhesive 118 is arranged between the component 100 and the foil 108. Through holes 114 extend through the foil 108 and the adhesive 118 and are filled with electrically conductive material contacting the component 100.

As can be taken from FIG. 11, the component carrier 102 is shaped as a plate and is embodied as a laminate-type printed circuit board (PCB).

FIG. 12 to FIG. 16 illustrate different cross-sectional views of structures obtained during carrying out a method of embedding a component 100 in a component carrier 102 according to an exemplary embodiment of the invention.

Figure 12:
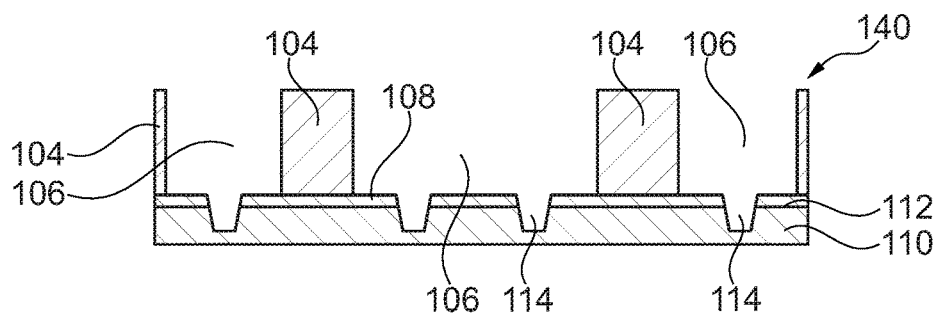
FIG. 12, FIG. 13, FIG. 14, FIG. 15 and FIG. 16 collectively illustrate different cross-sectional views of structures obtained during a performance of a method of embedding a component in a component carrier according to an exemplary embodiment of the invention.

Referring to FIG. 12, a structure is shown which is similar to that illustrated in FIG. 6. This structure can be manufactured with the two alternatives described above referring to FIG. 6 (i.e. the procedure described referring to FIG. 1 to FIG. 6, or a procedure of pressing and thereby interconnecting a core 104 on a structure as shown in FIG. 2, compare FIG. 17).

Figure 13:
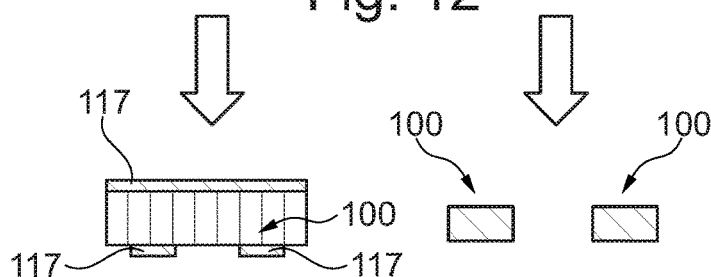

Referring to FIG. 13, multiple components 100 are provided which are to be embedded. More specifically, one of these components 100 is a semiconductor chip having pads 117 on both opposing main surfaces thereof. Other of these components 100 are two copper blocks embedded in the component carrier 102 for instance for improving cooling performance.

Figure 14:
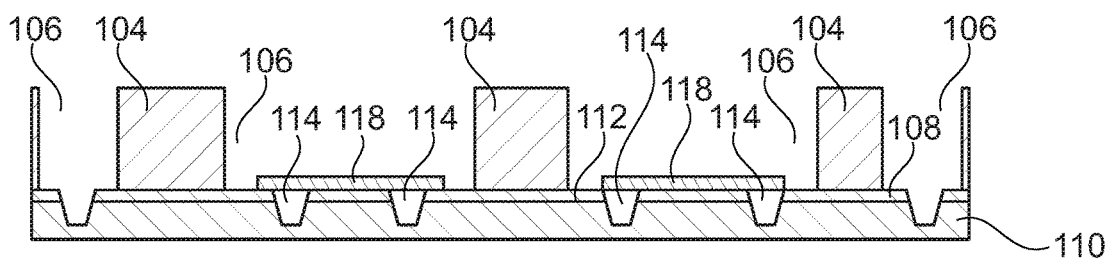

Referring to FIG. 14, dots of adhesive 118 are printed on mounting areas of the foil 108 on which these components 100 are to be mounted.

Figure 15:
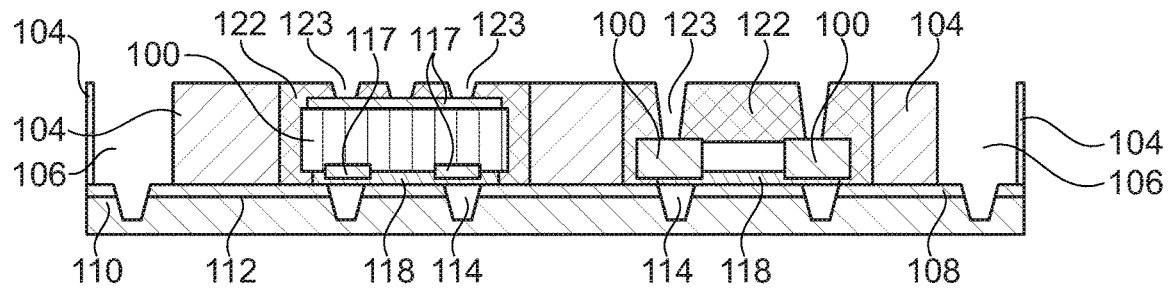

Referring to FIG. 15, the multiple components 100 are mounted in different ones of the cavities or recesses 106 on the foil 108 with only the adhesive 118 in between. Subsequently, remaining gaps are filled with filler material 122 which is applied and cured. Subsequently, access holes 123 may be formed, in particular by laser drilling.

Figure 16:
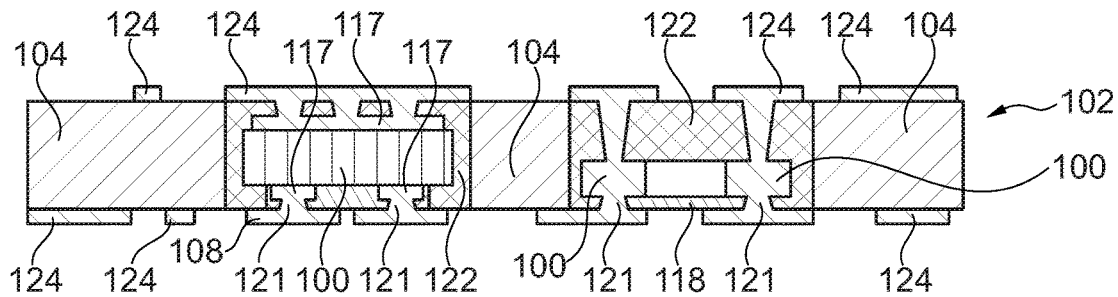

Referring to FIG. 16, the access holes 123 are filled with electrically conductive and thermally conductive material (in particular by copper), in particular by a plating process. The carrier structure 110 may be removed by peeling it off. A metal layer (in particular a further copper foil) may be laminated on top of the structure and may be patterned. Also foil 108 may be patterned. Thereby, any desired wiring pattern may be formed which constitutes electrically conductive layer structures 124.

The structure shown in FIG. 16 may be used as a readily manufactured component carrier 102. The embodiment according to FIG. 16 has the specific advantage that the dielectric material of the component carrier 102 is very compact. Furthermore, benefit may be made of the holes 114 which may be used as alignment markers for high registration accuracy. Alternatively, as with the component carrier 102 shown in FIG. 11, it is optionally possible that one or more further electrically insulating layer structures and/or electrically conductive layer structures 124 are laminated on one or both opposing main surfaces of the illustrated component carrier 102 (such further insulating layer structures and/or electrically conductive layer structures are not shown).

Figure 18:
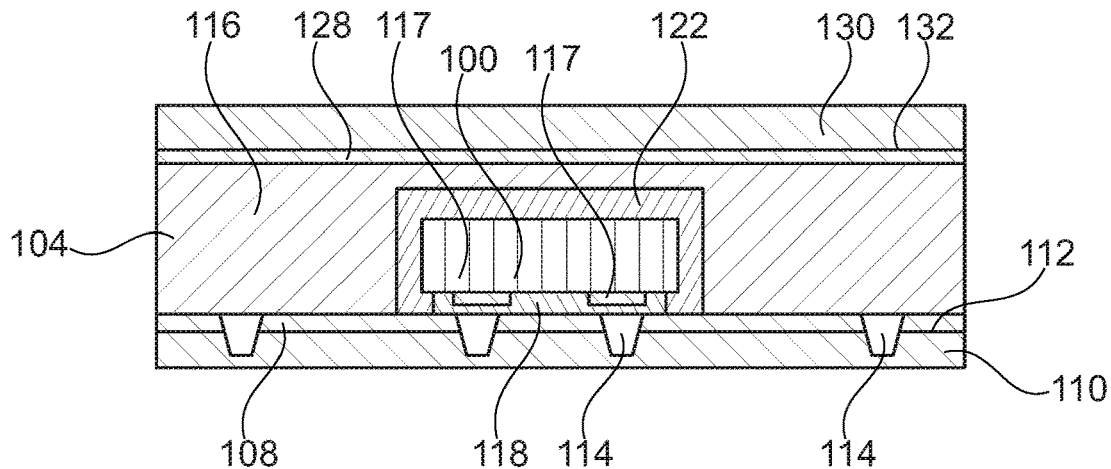
Figure 19:
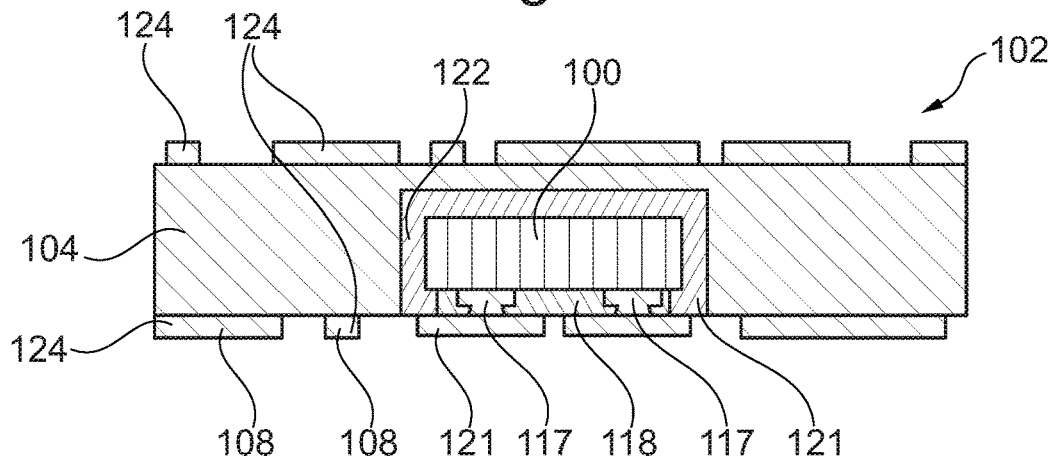

FIG. 17 to FIG. 19 illustrate different cross-sectional views of structures obtained during carrying out alternative methods according to other exemplary embodiments of the invention.

FIG. 17 illustrates a pre-cut core 104 (which may be at least partially uncured or fully cured) with cut recesses or gaps between the portions of the core 104 which is provided on top of a metallic double foil with interposed release layer 112 in which the holes 114 extend partly through the double metal foil. The two separate structures shown in FIG. 17 may be interconnected by pressing them together (in particular establishing a lamination connection), by gluing, etc. The auxiliary structure 140 according to FIG. 17 comprises a thin film or layer 137 of primer of adhesion promoting material on the foil 108 for promoting adhesion between the core 104 and the foil 108. This improves the mechanical stability.

Referring to FIG. 18, the manufacturing procedure described referring to FIG. 12 to FIG. 16 can alternatively also be carried out with a component 100 having pads 117 only on the lower main surface thereof. On top of the embedded component 100, a structure similar to that shown in FIG. 1 may be formed. After having peeled of the thick carrier structures 110, 130 from the structure shown in FIG. 18, patterning foils 108, 128 and formation of vertical through connections 121 by plating may be carried out for completing electrically conductive layer structures 124, as shown in FIG. 19.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multi-plicity of variants are possible which use the solutions shown and the principle according to the invention even in the case of fundamentally different embodiments.

The invention claimed is:

1. A method of embedding a component in a component carrier, the method comprising:
   providing a cured core with a recess on an electrically conductive foil;
   forming at least one hole in the electrically conductive foil,
   wherein at least one of the at least one hole is used for electrically contacting the component;
   after forming the at least one hole, mounting the component in the recess on the foil;
   filling a gap between the core and the component with a filler material; and
   forming at least one access hole in the filler material, wherein the access hole is used for electrically contacting the component;
   wherein at least one of the at least one hole is used as an alignment marker;
   wherein the alignment marker is used for double-sided contacting of the component.

2. The method according to claim 1, wherein an upper exposed surface of the cured core is free of electrically conductive material.

3. The method according to claim 1, wherein the electrically conductive foil is integrally connected with a carrier structure with a release layer in between.

4. The method according to claim 3, wherein the carrier structure is removed from the electrically conductive foil at the release layer after mounting the component.

5. The method according to claim 3, further comprising: forming the at least one hole in the electrically conductive foil and the carrier structure.

6. The method according to claim 5, wherein the at least one hole is filled with electrically and/or thermally conductive material for electrically and/or thermally contacting the component.

7. The method according to claim 3, further comprising:
   forming at least one hole in the electrically conductive foil and the carrier structure, wherein the hole has a shape of a truncated cone tapering from the electrically conductive foil towards the carrier structure.

8. The method according to claim 1, wherein the recess in the cured core is formed by:
   forming a patterned further release layer on the electrically conductive foil;
   applying electrically insulating material on the patterned further release layer and the electrically conductive foil; and
   removing the electrically insulating material on the patterned further release layer.

9. The method according to claim 1, further comprising:
   prior to mounting the component on the foil, applying an adhesive by one of dispensing and printing in the recess on the foil.

10. The method according to claim 1, further comprising:
    interconnecting at least one electrically conductive layer structure and/or at least one electrically insulating layer structure with the filler material and the cured core.

11. The method according to claim 1, further comprising:
filling a gap between the cured core and the component and covering the cured core and the component by laminating at least one electrically insulating layer structure on the cured core and the component.

12. The method according to claim 1, further comprising:
interconnecting a further electrically conductive foil above the cured core and the component, wherein the further electrically conductive foil is integrally connected with a further carrier structure by yet another release layer in between.

13. A method of embedding a component in a component carrier, the method comprising:
providing a cured core with a recess on an electrically conductive foil;
forming at least one hole in the electrically conductive foil,
wherein at least one of the at least one hole is used for electrically contacting the component;
after forming the at least one hole, mounting the component in the recess on the foil;
filling a gap between the core and the component with a filler material;
forming at least one access hole in the filler material, wherein the access hole is used for electrically contacting the component, wherein at least one of the at least one hole is used as an alignment marker;
interconnecting a further electrically conductive foil above the cured core and the component, wherein the further electrically conductive foil is integrally connected with a further carrier structure by yet another release layer in between; and
removing the further carrier structure from the further electrically conductive foil at the other release layer after the interconnecting.

* * * * *